United States Patent
Meier et al.

(10) Patent No.: US 8,693,244 B2
(45) Date of Patent: Apr. 8, 2014

(54) ELECTRONIC CIRCUIT WITH A FLOATING GATE TRANSISTOR AND A METHOD FOR DEACTIVATING A FLOATING GATE TRANSISTOR TEMPORARILY

(75) Inventors: Herbert Meier, Moosburg (DE); Jens Graul, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 307 days.

(21) Appl. No.: 13/271,913

(22) Filed: Oct. 12, 2011

(65) Prior Publication Data

US 2012/0106256 A1    May 3, 2012

(30) Foreign Application Priority Data

Oct. 27, 2010  (DE) ...................... 10 2010 049 503.4

(51) Int. Cl.
*G11C 11/34* (2006.01)
(52) U.S. Cl.
USPC ...................................... 365/185.01; 365/149
(58) Field of Classification Search
USPC ...................... 365/185.01, 149, 244; 257/300
See application file for complete search history.

(56) References Cited

U.S. PATENT DOCUMENTS

| | | | | |
|---|---|---|---|---|
| 4,486,859 A | * | 12/1984 | Hoffman | 365/185.08 |
| 4,528,684 A | * | 7/1985 | Iida et al. | 377/60 |
| 5,272,368 A | | 12/1993 | Turner et al. | |
| 5,717,935 A | * | 2/1998 | Zanders et al. | 713/300 |
| 6,961,279 B2 | * | 11/2005 | Simko | 365/226 |
| 2003/0235067 A1 | * | 12/2003 | Sakai et al. | 365/145 |
| 2009/0273012 A1 | | 11/2009 | Harris | |
| 2010/0020648 A1 | * | 1/2010 | La Rosa | 368/107 |

* cited by examiner

*Primary Examiner* — Douglas King
(74) *Attorney, Agent, or Firm* — William B. Kempler; Wade J. Brady, III; Frederick J. Telecky, Jr.

(57) ABSTRACT

An electronic circuit includes a floating gate transistor with a floating gate capacitor. The floating gate transistor can be programmed to be in an ON or an OFF state by charging the floating gate capacitor. The circuit further includes a deactivation capacitor adapted to store a charge sufficient for deactivating the floating gate transistor temporarily. The deactivation capacitor is connectable in series to the floating gate capacitor. A method for deactivating a floating gate transistor temporarily is provided, wherein the floating gate transistor includes a floating gate capacitor. A deactivation capacitor is charged with a charge sufficient for changing the state of the floating gate transistor temporarily. The deactivation capacitor is connected in series to the floating gate capacitor for deactivating the floating gate transistor.

14 Claims, 2 Drawing Sheets

ELECTRONIC CIRCUIT WITH A FLOATING GATE TRANSISTOR AND A METHOD FOR DEACTIVATING A FLOATING GATE TRANSISTOR TEMPORARILY

CROSS-REFERENCE TO RELATED APPLICATIONS

This patent application claims priority from German Patent Application No. 10 2010 049 503.4, filed Oct. 27, 2010, which is incorporated herein by reference in its entirety.

FIELD OF THE INVENTION

The invention relates to an electronic circuit comprising a floating gate transistor and to a method for deactivating a floating gate transistor temporarily.

BACKGROUND OF THE INVENTION

Floating gate transistors are well known in the state of the art. The gate of these transistors is "floating", i.e. it is surrounded by an insulator. This means that the plates of the associated floating gate capacitor are electrically isolated. Therefore, a relatively high programming voltage is necessary to charge the floating gate capacitor by using a tunneling effect. The advantage of floating gate transistors is that a charge on the floating gate capacitor stays unchanged over years. Thus, a floating gate transistor may be programmed to be in a switched ON or in a switched OFF position without the need of energy for maintaining the programmed state.

Floating gate transistors may be used for example in trimming circuitries in transponders, especially in passive transponders where energy saving is essential. However, other applications are possible.

FIG. 1 shows a simplified schematic of such a trimming circuit using a floating gate transistor according to the state of the art. An inductance 12 and capacitors 14 and 16 form together a resonant circuit connected between a voltage VDD and ground. A capacitor 18 in series connection with the drain-source channel of a MOS field effect transistor 20 is connected in parallel to the series connection of capacitors 14 and 16. A capacitor 22 represents the floating gate capacitor of transistor 20. Two switches 24 and 26 allow connection of the plates of floating gate capacitor 22 either to ground or to a programming voltage VPP, i.e. a voltage sufficiently high to allow charges to tunnel to the plates. The plate of floating gate capacitor 22 which is connected to the gate of transistor 20 is coupled to switch 24 via protective anti-parallel zener diodes 28.

For trimming or adjusting the resonant frequency, capacitor 18 can be connected in parallel to the resonant circuit. Therefore, transistor 20 is used as a switch: if transistor 20 is conductive, capacitor 18 is connected in parallel, and if transistor 20 is not conductive, capacitor 18 is not switched in parallel.

For switching transistor 20, floating gate capacitor 22 is charged with different polarity. With switch 24 switched to ground and switch 26 switched to programming voltage VPP, floating gate transistor 20 is programmed ON. With switch 24 switched to programming voltage VPP and switch 26 switched to ground, floating gate transistor 20 is programmed OFF.

It is a disadvantage of floating gate transistors that a rather high programming voltage is needed for switching. A further disadvantage of floating gate transistors is that switching of a floating gate transistor requires several milliseconds.

In some applications a quick but short deactivation of the current state of a floating gate transistor, i.e. a short ON-OFF switching is desired. Examples are changing the resonant frequency of a resonant circuit to frequency modulate a signal or switching a parallel resonant circuit into a serial resonant circuit for example in oscillation maintenance circuits in passive half duplex transponders.

Additionally, in some of these applications energy consumption must be kept to an absolute minimum. Examples of these applications are passive half duplex transponders which have no battery at all or only a backup battery. Passive half duplex transponders get their energy out of a received high frequency signal and store this energy on a capacitor for use in sending a response signal. Thus, there is little energy available, and when the capacitor is discharged there is no supply voltage available at all.

There is a need for an electronic circuit comprising a floating gate transistor in which the programmed floating gate transistor can be deactivated temporarily even if there is no supply voltage available.

SUMMARY OF THE INVENTION

It is a general object of the invention to provide an electronic circuit comprising a floating gate transistor with a floating gate capacitor.

In an aspect of the invention the floating gate transistor can be programmed to be in an ON or an OFF state by charging the floating gate capacitor. The electronic circuit further comprises a deactivation capacitor which is adapted to store a charge necessary for deactivating the floating gate transistor temporarily. The deactivation capacitor can be connected in series to the floating gate capacitor. Thus, it is not necessary to charge or discharge the floating gate capacitor which would require a high programming voltage and a relatively long switching time.

In an embodiment, the deactivation capacitor is connected with a first terminal to a first terminal of the floating gate capacitor. A first switch is connected between the first terminal of the deactivation capacitor and ground whereas a second switch is connected between a second terminal of the deactivation capacitor and ground. The circuit further comprises a third switch connected between the second terminal of the deactivation capacitor and a supply voltage.

The switches may be controlled to be in a charge position with the first and third switches closed and the second switch open during a first time interval. In the case of a passive transponder receiving energy by an RF pulse, the first time interval may be synchronized with the detection of a received pulse. Otherwise, the first time interval may be as long as necessary to make sure that there is a supply voltage available. The supply voltage may be supplied by a charged capacitor.

The switches may be further controlled to be in a deactivating position with the first and third switches open and the second switch closed during a second time interval. Thus, during the second time interval, the deactivation capacitor will be connected in series to the floating gate capacitor and change the state of the floating gate transistor as long as the charge on the deactivation capacitor is sufficiently high. The floating gate transistor is deactivated.

In a further embodiment, the circuit comprises a fourth switch which is coupled to connect a second terminal of the floating gate capacitor either to a programming voltage or to ground, wherein the programming voltage is higher than the supply voltage. The switches are controlled to be in a first programming position with the first switch closed, the second and third switches open, and the fourth switch switched to the programming voltage during a third time interval.

In a further embodiment, the circuit comprises a fifth switch connected between the first terminal of the floating gate capacitor and the programming voltage. The switches are controlled to be in a second programming position with the first, the second and third switches open, the fourth switch switched to ground and the fifth switch closed during a fourth time interval. The floating gate capacitor is thus charged in a different polarity compared to the charge in the first programming position.

In an embodiment, the circuit is an integrated CMOS circuit. The first switch may comprise anti-serial connected N-channel MOS field effect transistors of an enhancement type.

In an embodiment, the second switch comprises an N-channel MOS field effect transistor of an enhancement type and the third switch comprises a P-channel MOS field effect transistor of an enhancement type. The gates of the transistors of the second and the third switch are interconnected.

In an embodiment, the circuit is part of a passive transponder.

The invention further provides a method for deactivating a floating gate transistor temporarily, wherein the floating gate transistor comprises a floating gate capacitor. The method comprises charging a deactivation capacitor with a charge sufficient for changing the state of the floating gate transistor temporarily. The method further comprises connecting the deactivation capacitor in parallel to the floating gate capacitor for deactivating the floating gate transistor.

In an embodiment, the method further comprises charging the deactivation capacitor during a first time interval by closing a first switch which is connected between a first terminal of the deactivation capacitor and ground and opening a second switch which is connected between a second terminal of the deactivation capacitor and ground. During the first time interval, a third switch is closed which is connected between a second terminal of the deactivation capacitor and a supply voltage. Thus, the deactivation capacitor is connected between the supply voltage and ground and charged. The method further comprises deactivation of the floating gate transistor temporarily during a second time interval. During the second time interval, the first switch is opened and the second switch is closed. The third switch is opened. Thus, the deactivation capacitor is connected in series to the floating gate capacitor and the floating gate transistor is deactivated as long as the charge on the deactivation capacitor is sufficiently high.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 1:
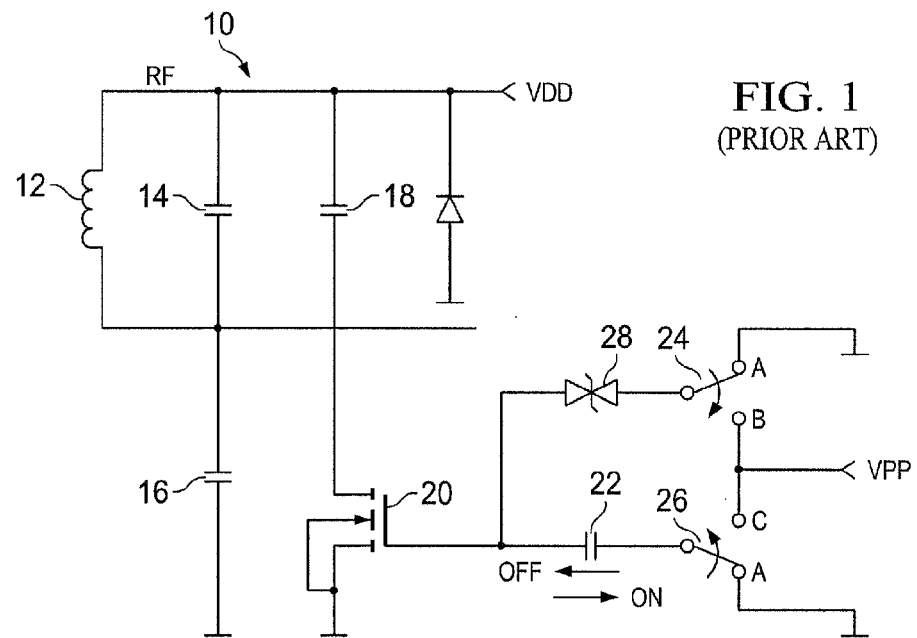
FIG. 1 is a schematic of a trimming circuit according to the state of the art.
Figure 2:
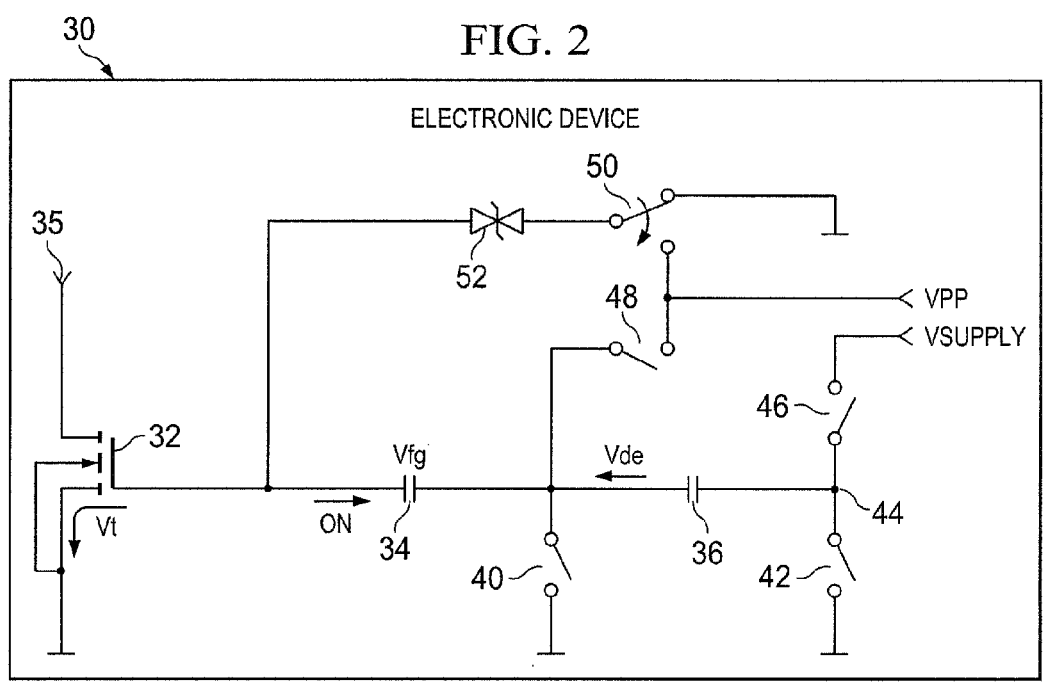
FIG. 2 is a schematic of the circuit according to the invention.

FIG. 2 shows an electronic circuit 30 according to the invention comprising a floating gate transistor 32 with a floating gate capacitor 34. Electronic circuit 30 is included in an electronic device, for example a passive transponder. The floating gate transistor 32 is an N-channel MOS field effect transistor of an enhancement type and connected with its drain-source channel between a not shown circuit at a connection 35, for example a trimming circuit as in FIG. 1, and ground. It is to be understood, that transistor 32 is used as switch in an application in which the switch must change its switch position temporarily.

The circuit further comprises a deactivation capacitor 36. Deactivation capacitor 36 is connected with a first terminal to a first terminal of the floating gate capacitor 34 at a node 38. A first switch 40 is connected between the first terminal of deactivation capacitor 36, i.e. node 38 and ground. A second switch 42 is connected between a second terminal of deactivation capacitor 36, i.e. a node 44 and ground. A third switch 46 is connected between the second terminal of deactivation capacitor 36, i.e. node 44 and a supply voltage VSUPPLY. When the application in which the invention is used is a passive transponder, the supply voltage is delivered by a capacitor which is charged by an RF pulse.

A fourth switch 48 is connected between the first terminal of deactivation capacitor 36, i.e. node 38 and a programming voltage VPP. A fifth switch 50 is connected via a pair of protective anti-serial zener-diodes 52 to a second terminal of floating gate capacitor 34, i.e. a node 54 and may be switched between ground and the programming voltage VPP.

In operation, in a first step the floating gate capacitor 34 is charged, i.e. the floating gate transistor 32 is programmed by applying the programming voltage to the floating gate capacitor 34. Although programming of a floating gate transistor is known as such, it will be explained shortly below.

For a first polarity, i.e. for programming transistor 32 ON, switch 40 is closed and switches 42, 46 and 48 are opened. Switch 50 is switched to the programming voltage. Thus, the floating gate capacitor 34 is connected between the programming voltage and ground and charged using the tunneling effect. When programming is completed, switch 50 is switched to ground. Floating gate transistor 32 is thus programmed to be ON as indicated in FIG. 2.

For a second polarity, i.e. for programming transistor 32 OFF, switches 40, 42 and 46 are opened, switch 50 is switched to ground and switch 48 is closed. Thus, floating gate capacitor 34 is connected between the programming voltage and ground, but with changed polarity, and charged using the tunneling effect. When programming is completed, switch 48 is opened. Floating gate transistor 32 is thus programmed to be OFF.

For temporarily deactivating the programmed transistor, the circuit of FIG. 2 dispenses with the need to reprogram the transistor what necessitates applying a high programming voltage and requires a relatively long switching time of several milliseconds.

Instead, as soon as a supply voltage is available, i.e. in a first time interval, deactivation capacitor 36 is charged. The capacitance of deactivation capacitor 36 is chosen to allow a charge to be stored which is sufficient for deactivating the floating gate transistor temporarily.

For charging, switches 40 and 46 are closed while switches 42 and 48 are opened and switch 50 is switched to ground. Thus, deactivation capacitor 36 is connected between ground and a supply voltage VSUPPLY. In an embodiment the supply voltage is delivered by a transponder supply capacitor which is charged by RF pulses. If this capacitor is sufficiently charged, deactivation capacitor 36 will be charged.

For deactivating floating gate transistor 32, deactivation capacitor 36 is connected in series to floating gate capacitor 34 by opening switch 40 and switch 46 and closing switch 42. A voltage Vde across deactivation capacitor 36 will thus add to a voltage Vfg across the floating gate capacitor 34. While voltage Vfg is positive versus ground in the example given, voltage Vde is negative versus ground. Therefore, the gate voltage of the floating gate transistor 32 will decrease. When the resulting voltage falls below the threshold voltage of floating gate transistor 32, the transistor changes state, i.e. the transistor is deactivated.

Figure 3:
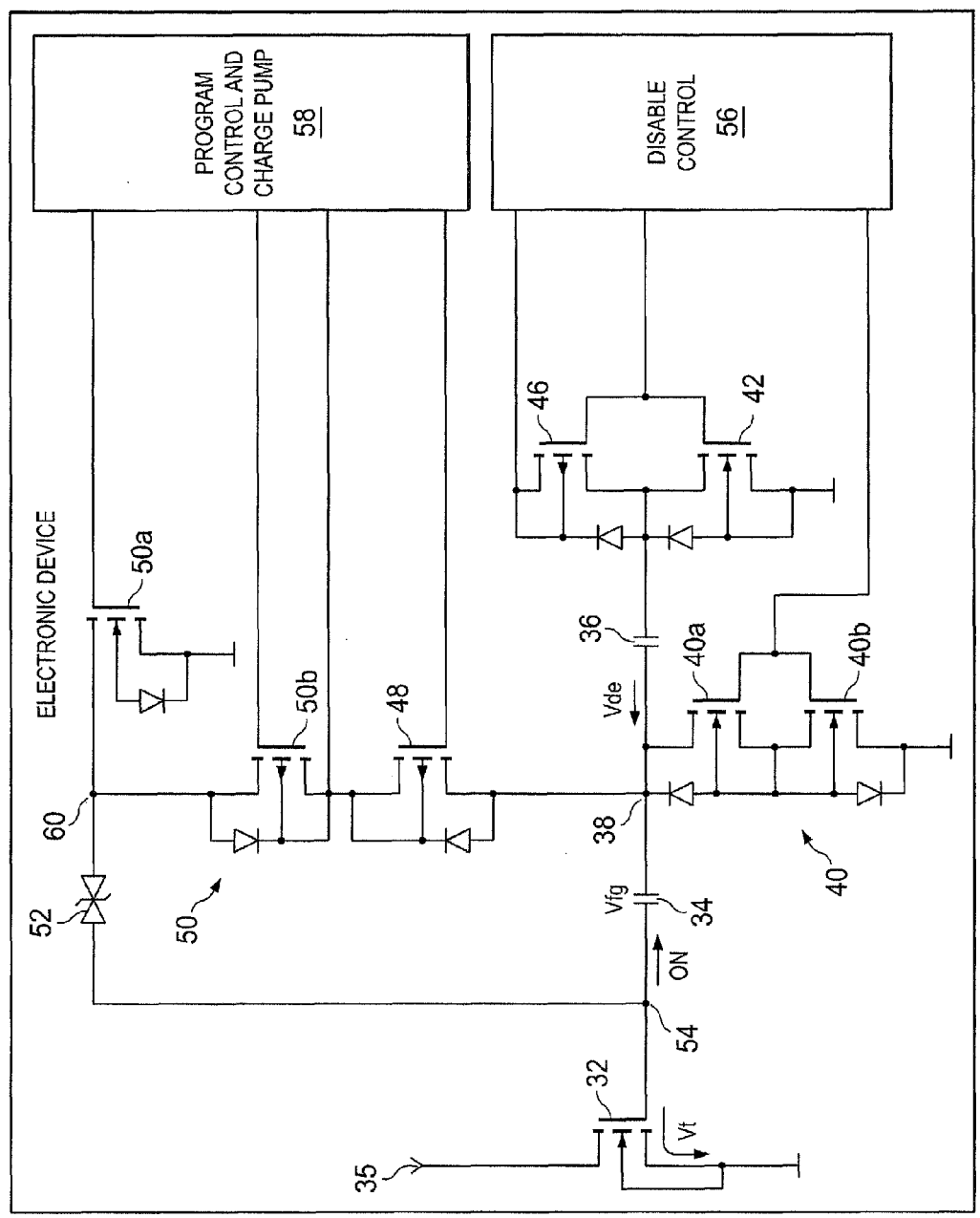
FIG. 3 is a schematic of the circuit according to the invention comprising more details.

FIG. 3 shows the circuit of FIG. 2 in more detail when realized in a CMOS process with floating gate transistor 32, floating gate capacitor 34 and deactivation capacitor 36. Where appropriate the same reference signs as in FIG. 2 are used.

Switch 40 is realized by two anti-serial connected N-channel MOS field effect transistors of an enhancement type 40a and 40b. The gates of transistor 40a and 40b are interconnected and connected to a first output of a disable control circuit 56. A high digital control signal switches switch 40 to an ON state, whereas a low digital signal output from disable control circuit 56 switches switch 40 to an OFF state, i.e. switch 40 is opened.

Switch 42 is realized by an N-channel MOS field effect transistor of an enhancement type. Switch 46 is realized by a P-channel MOS field effect transistor of an enhancement type. Transistors 42 and 46 are interconnected by their gates which are connected to a second output of disable control circuit 56. A high digital control signal output from disable control circuit 56 switches transistor 42 into an ON state and transistor 46 into an OFF state. A low digital control signal output from disable control circuit 56 switches transistor 42 into an OFF state and transistor 46 into an ON state. Disable control circuit 56 delivers the supply voltage on a third output.

Switch 48 is realized by a P-channel MOS field effect transistor of an enhancement type. The gate of transistor 48 is connected to a first output of a program control circuit and charge pump 58. A high digital signal output from the first output of the program control circuit switches transistor 48 into an OFF state, i.e. node 38 is disconnected. A low digital signal switches transistor 48 into an ON state, node 38 is connected to programming voltage VPP and floating gate transistor may be programmed OFF. The programming voltage VPP is delivered by program control circuit and charge pump 58 on a second output and is higher than the supply voltage.

Switch 50 is realized by an N-channel MOS field transistor of the enhancement type 50a and a P-channel MOS field effect transistor of an enhancement type 50b. Transistor 50b is connected with its drain-source channel between the second output of program control circuit and charge pump 58, i.e. the programming voltage VPP, and zener-diodes 52 at a node 60. Transistor 50a is connected with its drain-source channel between ground and the node 60.

Transistor 50b is connected with its gate to a third output of program control circuit and charge pump 58. A high digital signal output from the third output of program control circuit 58 switches transistor 50b into an OFF state, i.e. node 60 is disconnected from programming voltage VPP. A low digital signal switches transistor 50b into an ON state, thus node 60 is connected to the programming voltage VPP and floating gate transistor 32 may be programmed ON.

Transistor 50a is connected with its gate to a fourth output of program control circuit and charge pump 58. A high digital signal output from the fourth output of program control circuit 58 switches transistor 50a into an ON state, i.e. node 60 is connected to ground and floating gate transistor 32 may be programmed OFF. A low digital signal switches transistor 50a into an OFF state, i.e. node 60 is disconnected from ground and floating gate transistor 32 may be programmed ON.

Although the invention has been described in detail, it should be understood that various changes, substitutions and alterations can be made thereto without departing from the spirit and scope of the invention as defined by the appended claims.

The invention claimed is:

1. An electronic circuit, comprising:
a floating gate transistor with a floating gate capacitor, wherein the floating gate transistor can be programmed to be in an ON or an OFF state by charging the floating gate capacitor;
a deactivation capacitor adapted to store a charge sufficient for deactivating the floating gate transistor temporarily, the deactivation capacitor being connectable in series to the floating gate capacitor.

2. The circuit of claim 1, wherein
the deactivation capacitor is connected with a first terminal to a first terminal of the floating gate capacitor; the circuit further comprising
a first switch connected between the first terminal of the deactivation capacitor and ground;
a second switch connected between a second terminal of the deactivation capacitor and ground;
a third switch connected between the second terminal of the deactivation capacitor and a supply voltage, wherein
the switches are controlled to be in a charge position with the first and third switches closed and the second switch open during a first time interval, and to be in a deactivating position with the first and third switches open and the second switch closed during a second time interval.

3. The circuit of claim 2, further comprising:
a fourth switch coupled to connect a second terminal of the floating gate capacitor either to a programming voltage or to ground, the programming voltage being higher than the supply voltage, wherein the switches are controlled to be in a first programming position with the first switch closed, the second and third switches open and the fourth switch switched to the programming voltage during a third time interval.

4. The circuit of claim 3, further comprising:
a fifth switch connected between the first terminal of the floating gate capacitor and the programming voltage, wherein the switches are controlled to be in a second programming position with the first, the second and third switches open, the fourth switch switched to ground and the fifth switch closed during a fourth time interval.

5. The circuit of claim 4, wherein
the floating gate transistor is an N-channel MOS field effect transistor of an enhancement type; and
the first switch comprises two anti-serial connected N-channel MOS field effect transistors of an enhancement type.

6. The circuit of claim 5 wherein the second switch comprises an N-channel MOS field effect transistor of an enhancement type and the third switch comprises a P-channel MOS field effect transistor of an enhancement type, the gates of the transistors of the second and the third switch being interconnected.

7. The circuit of claim 3, wherein
the floating gate transistor is an N-channel MOS field effect transistor of an enhancement type; and
the first switch comprises two anti-serial connected N-channel MOS field effect transistors of an enhancement type.

8. The circuit of claim 7, wherein the second switch comprises an N-channel MOS field effect transistor of an enhancement type and the third switch comprises a P-channel MOS field effect transistor of an enhancement type, the gates of the transistors of the second and the third switch being interconnected.

9. The circuit of claim 2, wherein
the floating gate transistor is an N-channel MOS field effect transistor of an enhancement type; and
the first switch comprises two anti-serial connected N-channel MOS field effect transistors of an enhancement type.

10. The circuit of claim 9, wherein the second switch comprises an N-channel MOS field effect transistor of an enhancement type and the third switch comprises a P-channel MOS field effect transistor of an enhancement type, the gates of the transistors of the second and the third switch being interconnected.

11. The circuit of claim 10, wherein the circuit is an integrated CMOS circuit.

12. A passive transponder comprising the circuit of claim 11.

13. A method for deactivating a floating gate transistor temporarily, wherein the floating gate transistor comprises a floating gate capacitor, the method comprising:
charging a deactivation capacitor with a charge sufficient for changing the state of the floating gate transistor temporarily;
connecting the deactivation capacitor in series to the floating gate capacitor for deactivating the floating gate transistor.

14. The method of claim 13, further comprising:
charging the deactivation capacitor during a first time interval by closing a first switch which is connected between a first terminal of the deactivation capacitor and ground;
opening a second switch which is connected between a second terminal of the deactivation capacitor and ground;
closing a third switch which is connected between a second terminal of the deactivation capacitor and a supply voltage; and
deactivating the floating gate transistor temporarily during a second time interval by opening the first switch;
closing the second switch; and
opening the third switch.

* * * * *